United States Patent [19]
Fujii et al.

[11] Patent Number: 5,006,363
[45] Date of Patent: Apr. 9, 1991

[54] PLASMA ASSITED MO-CVD OF PEROOSKITE DALECTRIC FILMS

[75] Inventors: Eiji Fujii, Osaka; Hideo Torii, Higashiosaka; Masaki Aoki, Minoo, all of Japan

[73] Assignee: Matsushita Electric Industries Co., Ltd., Osaka, Japan

[21] Appl. No.: 446,767

[22] Filed: Dec. 6, 1989

[30] Foreign Application Priority Data

Dec. 8, 1988 [JP] Japan .................. 63-311071
Mar. 30, 1989 [JP] Japan .................. 1-80339

[51] Int. Cl.$^5$ .................. B05D 3/06; B05D 3/14
[52] U.S. Cl. .................. 427/39; 427/38; 427/47; 427/255.3; 427/126.3; 427/314
[58] Field of Search .......... 427/39, 38, 255.3, 255.2, 427/255.1, 314, 248.1, 126.3, 47; 118/723

[56] References Cited
U.S. PATENT DOCUMENTS 4,717,584  1/1988  Aoki et al. .................. 427/38

FOREIGN PATENT DOCUMENTS 1-0055459  7/1982  European Pat. Off. .

OTHER PUBLICATIONS

Berg et al., "Fractional Sublimation of Various Metal Chelates of Dipivaloylmethane" Anal. Chim. Acta 60 P117-125 (1972).
Prakash "Thin Film Studies of Oxides by the Organometallic-CVD Technique" Prog. Crystal. Growth and Charact. 1983 vol. 6 pp. 371-391.
C. Feldman, Rev. Sci. Inst., 26, 463 (1955).
A. E. Feuersanger et al., J. Electrochem. Soc., 111, 1387 (1964).
T. L. Rose et al., J. Appl. Phys., 55, 3706 (1984).
M. Okuyama et al., Jpn. J. Appl. Phys. 22, Suppl. 21-1, 465 (1983).
R. Takayama et al., Jpn. J. Appl. Phys., 61, 411 (1987).
M. Okada et al., J. Ceram. Soc. Jpn., 96, 687 (1988).
E. Fujii et al., J. Magn. Soc. Jpn., 12, 2, 339 (1988).

Primary Examiner—Norman Morgenstern
Assistant Examiner—Roy V. King
Attorney, Agent, or Firm—Wenderoth, Lind & Ponack

[57] ABSTRACT

Disclosed is a method of forming a Perovskite-type dielectric film on a substrate under low temperature by decomposing and reacting vapor of organometallic compound containing metal for the dielectric, vapor of organometallic compound containing titanium, and oxygen in a reduced-pressure and plasma.

18 Claims, 1 Drawing Sheet

PLASMA ASSITED MO-CVD OF PEROOSKITE DALECTRIC FILMS

BACKGROUND OF THE INVENTION

1. Field of the Invention

The present invention relates to a method of manufacturing Perovskite dielectric film which has outstanding dielectric and pyroelectric characteristics and is widely used for making capacitors and infrared sensors for example.

2. Description of the Prior Art

Owing to outstanding dielectric and pyroelectric characteristic, Perovskite-type dielectric material is widely used for a variety of industrial requirements.

Because of very high resistivity and dielectric constant, barium titanate $BaTiO_3$ is widely used for making ceramic filters and highly-dielectric capacitors. On the other hand, ceramics made from strontium titanate $SrTiO_3$ is mainly used for making power-supply capacitors due to less depending on the voltage in the presence of high voltage, although the dielectric constant is lower than that of the barium titanate. Magnesium titanate $MgTiO_3$ and calcium titanate $CaTiO_3$ feature outstanding temperature characteristics of dielectric constant and minimum dielectric loss factor. In particular, since magnesium titanate has the positive value of temperature coefficient of dielectric constant and calcium titanate has the negative value, both the dielectric constant and temperature coefficient of the dielectric constant are freely variable by manufacturing the blends $(Mg, Ca)TiO_3$. Owing to this advantage, the blend material is widely used for manufacturing temperature-compensative capacitors in a substantial volume. On the other hand, due to outstanding pyroelectric characteristics, lead titanate $PbTiO_3$ is widely used for making pyroelectric infrared sensors.

Recently, there is a positive movement among the concerned to make more compact and light-weight electronic parts. They positively follow up research on the effective application of thin film made from dielectric material to the production of compact capacitors having large capacity and monolithic sensors incorporating either field-effect transistors (FET) or bipolar transistors installed on the identical substrate.

Actually, there are few reports on the production of thin film made from strontium titanate, magnesium titanate, and calcium titanate. Conversely, there are a number of reports on the production of thin film made from barium titanate and lead titanate.

Study on the production of barium titanate during the past years was based on the vacuum evaporation process like the one announced by C. Feldman, Rev. Sci. Inst., 26, 463 (1955) and A. E. Feuersanger, J. Electrochem. Soc., 111, 1387 (1964) for example.

Nevertheless, when producing complex oxide like barium titanate for example, since the speeds of evaporating barium and titanium from the evaporation source are different from each other, their mol ratio cannot properly be controlled. Furthermore, since barium titanate has a very high melting point, heater material is necessarily blended with barium titanate, thus generating disadvantage. To solve this problem, recently, those who skilled in the art mostly follow up study on the production of barium titanate film by applying a RF-sputtering process using barium-titanate ceramic sheet as target. This process yields barium titanate film having a minimum of dielectric constant 1,000. This was reported by T. L. Rose, E. M. Kelliher, A. N. Scoville, and S. E. Stone, J. Appl. Phys., 55, 37.06 (1984) for example.

On the other hand, when producing barium titanate film based on the conventional RF-sputtering process, in order to make such barium titanate having a minimum of dielectric constant 1,000, a minimum of 900° C. of the substrate temperature or heating temperature is needed for securely forming thin film. In many cases, as a result of heat treatment with extremely high temperature and due to the growth of crystalline granules, either microscopic cracks or pin holes are generated. As a result, after formation of electrodes by evaporation, short-circuit is likely to be generated.

Likewise, a variety of trials were carried out for producing thin film made from lead titanate. Actually, those infrared sensors composed of poly-crystalline film of lead titanate were experimentally produced, where the produced film had such physical characteristics close to those of the bulk material. This was reported by M. Okuyama et al., in Jpn J. Appl. Phys. 22, Suppl. 21-1, 465 (1983) for example.

Furthermore, in order to effectively utilize the physical property of lead titanate which generates spontaneous polarization in the direction of the axis C, such an epitaxial film oriented in the direction of the axis C is produced. The produced film is provided with outstanding pyroelectric characteristics which triples the proper pyroelectric characteristics of bulk material. This was reported by R. Takayama et al., in Jpn. J. Appl. Phys., 61, 411 (1987).

Nevertheless, when producing thin film by means of the RF-sputtering process, film cannot be formed very quickly, and yet, since the sputtering rate varies according to the kinds of elements blended in the complex oxide, it is still difficult to properly control the structure of the formed film based on the stoichiometry. To overcome those problems, trials are underway for producing lead-titanate film based on the MO-CVD method which is capable of minimizing such defect mentioned above. As a result, such an epitaxial film oriented in the direction of the axis C has already been produced at a very fast depositing speed which is extremely faster than the RF-sputtering process at 500° C. through a maximum of 600° C. of the substrate temperature. This was reported by M. Okada et al., in J. Ceram. Soc. Jpn., 96, 687 (1988).

Nevertheless, in order to properly yield lead-titanate film oriented in the direction of the axis C by applying either the RF-sputtering or the MO-CVD process, it is essential for the system to heat the substrate to a minimum of 500° C.

SUMMARY OF THE INVENTION

An object of the invention is to provide a novel method of manufacturing dielectric film featuring outstanding dielectric and pyroelectric characteristics comparable to or surpassing those of bulk material at a temperature lower than, and a deposition speed faster than, the conventional RF-sputtering process and MO-CVD process.

To achieve the above object, the invention provides a plasma-excitation MO-CVD processing system for manufacturing a dielectric film, which decomposes and excites a blended gas of vapor of organometallic compound containing elements composing the dielectric and oxygen in plasma generated by either high-frequency discharge or electron cyclotron resonance (ECR) under 10 through $10^{-4}$ Torr of reduced pressure, to thereby generate active radical or ion so that a dielectric film can eventually be formed on a substrate.

If less than $10^{-4}$ Torr of reduced pressure were used for maintaining plasma, the film formation speed of the reacted material will be retarded. If this occurs, it raises a practical problem. Conversely, if more than 10 Torr of pressure were applied, plasma will not be able to effectively function itself. Accordingly, it is desired that the plasma be maintained under the reduced pressure ranging from 10 to $10^{-4}$ Torr.

By using an organometallic compound composed of a β-diketone metal complex containing barium or strontium (e.g., barium dipivaloyl methane Ba(DPM)$_2$, DPM=C$_{11}$H$_{19}$O$_2$, strontium dipivaloyl methane Sr(DPM)$_2$) and an organometallic compound composed of either a β-diketone metal complex containing titanium (e.g., titanium oxy-acetyl-acetonate TiO(AA)$_2$, AA=C$_5$H$_7$O$_2$) or a metal alkoxide containing titanium (e.g., titanium tetra-isopropoxide Ti(OC$_3$H$_7$)$_4$), a barium titanate (BaTiO$_3$) film or a strontium titanate (SrTiO$_3$) film having dielectric characteristics comparable to that of bulk material can be formed at a substrate temperature of 400° C. or less.

By using an organometallic compound composed of a β-diketone metal complex containing magnesium (e.g., magnesium acetyl acetonate Mg(C$_5$H$_7$O$_2$)$_2$), an organometallic compound composed of a β-diketone metal complex containing calcium (e.g., calcium dipivaloyl methane Ca(DPM)$_2$), and an organometallic compound composed of a β-diketone metal complex containing titanium or a metal alkoxide containing titanium, a magnesium-calcium titanate (Mg, Ca)TiO$_3$ film having dielectric characteristics comparable to or surpassing those of bulk material can be formed at a substrate temperature of 600° C. or lower.

By using an organometallic compound containing titanium and an organometallic compound composed of a β-diketone metal complex containing lead such as lead acetyl acetonate Pb(C$_5$H$_7$O$_2$)$_2$ or a tetraethyl lead Pb(C$_2$H$_5$)$_4$ or a tetraphenyl lead Pb(C$_6$H$_5$)$_4$, then, a lead titanate PbTiO$_3$ film is formed at a substrate temperature of 300° C. or lower, which is oriented in the direction of the axis C and has epitaxially grown with respect to the substrate (made of MgO(100) for example). The formed lead titanate film is provided with satisfactory dielectric an pyroelectric characteristic comparable to or surpassing those of bulk material.

As mentioned above, in the method of manufacturing dielectric film according to the present invention, an organometallic compound, as the starting raw material is decomposed and excited by applying activation of plasma so that activated radical or ion can be generated to form a dielectric film. Accordingly, the method embodied by the invention can securely produce satisfactory dielectric film featuring outstanding dielectric characteristics and pyroelectric characteristics comparable to or surpassing those of bulk material at a temperature lower than, and at a deposition speed faster than, those of the conventional vacuum evaporation, RF-sputtering, or MO-CVD process.

Inventors of the invention previously reported that oxide magnetic thin films can be produced by the plasma-excitation MO-CVD process at a temperature lower than those of the conventional RF-sputtering and MO-CVD processes in the report presented by E. Fujii et al., in J. Magn. Soc. Jpn, 12, 2 (1988). The present invention proves that the plasma-excitation MO-CVD process is effective for the production of Perovskite-type dielectric films.

DESCRIPTION OF THE PREFERRED EMBODIMENTS

The first embodiment

Figure 1:
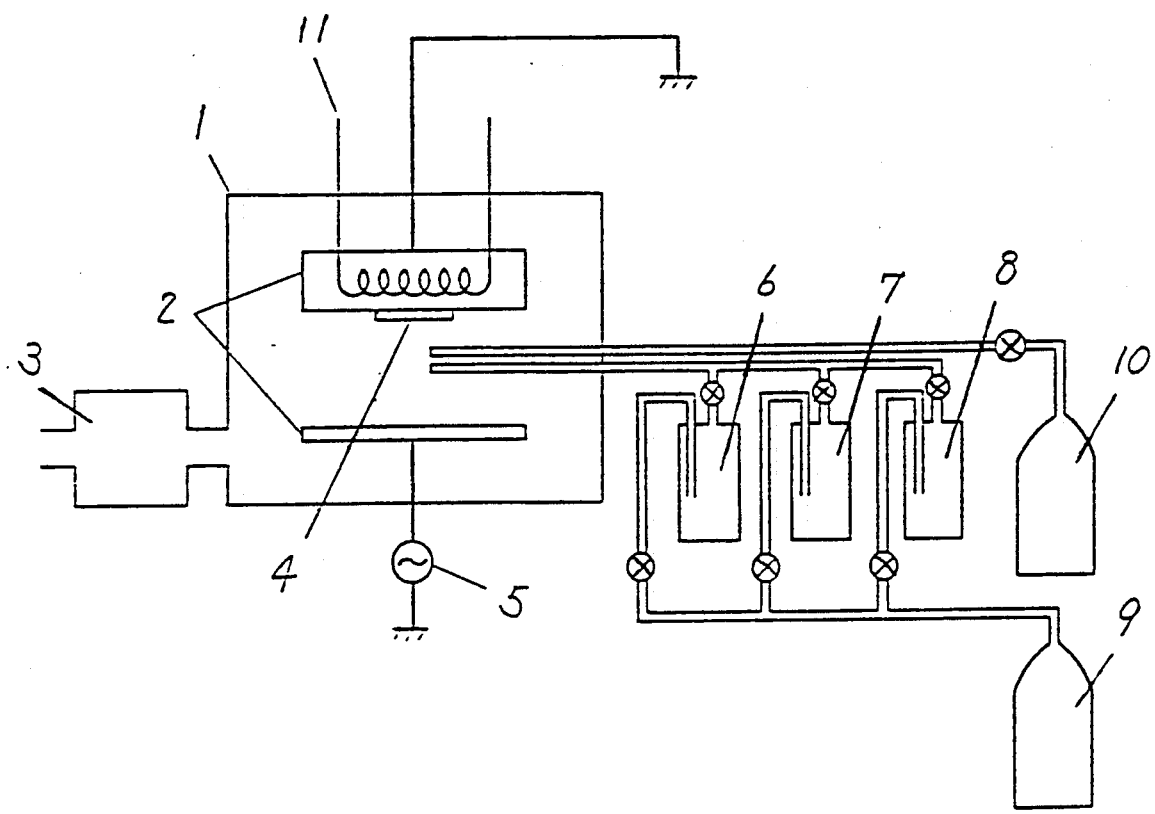
FIG. 1 is a schematic block diagram of an embodiment of a plasma-CVD apparatus according to the invention.

Refer to FIG. 1. The reference numeral 1 designates a reaction chamber, 2 electrodes, and 3 a gas-exhaust device including an oil-sealed pump and a mechanical booster pump to constantly maintain the interior of the reaction chamber 1 under a predetermined reduced pressure. The reference numeral 4 designates a substrate, 5 a high-frequency power-supply source (13.56 MHz), 6, 7 and 8 are respectively containers, or vaporizers, each storing an organometallic compound which is a starting raw material. The reference numeral 9 designates a carrier-gas (N$_2$) cylinder, 10 a reaction-gas (O$_2$) cylinder, and 11 a heater for heating the substrate 4.

First, barium dipivaloyl methane [Ba(DPM)$_2$] is stored in the container 6 and titanium tetra-isopropoxide [Ti(OC$_3$H$_7$)$_4$] was stored in the container 7. After heating the contents in the containers 6 and 7 at 140° C. and 70° C., respectively, the vaporized compounds were introduced with nitrogen carrier (4.0 SCCM flow rate) into the inner space of the reaction chamber 1 which was reduced in pressure by the exhaust device 3. Simultaneously, oxygen as the reaction gas was supplied to the inner space of the reaction chamber 1 at 12.0 SCCM flow rate. Next, plasma was generated by supplying 0.5 W/cm$^2$ of electric power. Next, reaction was continued for 40 minutes under a low pressure reduced to $8.2 \times 10^{-2}$ Torr to form a dielectric film on the platinum substrate 4 which was constantly heated at 350° C.

By analyzing the obtained film, it was proved that the film was a barium-titanate (BaTiO$_3$) film having a Perovskite-type crystal structure and a thickness of 2.2 microns. Then, opposite platinum electrodes were formed by evaporation and then the dielectric properties were measured. The result was: $\epsilon\gamma = 4100$ and $\tan\delta = 0.08$.

The same method was repeated using other kinds of organometallic compounds as the starting raw material. Like the above case, satisfactory barium titanate films having outstanding dielectric characteristics were obtained. The result of the first embodiment is shown in Table 1.

TABLE 1

| Sample No. | Starting material | | Substrate temperature (°C.) | $\epsilon\gamma$ | $\tan\delta$ | Formed film |
|---|---|---|---|---|---|---|
| | Vaporizer 6 | Vaporizer 7 | | | | |
| 1 | Ba(C$_{11}$H$_{19}$O$_2$)$_2$ | Ti(OC$_3$H$_7$)$_4$ | 350 | 4100 | 0.08 | BaTiO$_3$ |

TABLE 1-continued

| Sample No. | Starting material Vaporizer 6 | Vaporizer 7 | Substrate temperature (°C.) | $\epsilon\gamma$ | tan δ | Formed film |
|---|---|---|---|---|---|---|
| 2 | $Ba(C_{11}H_{19}O_2)_2$ | $Ti(n-C_3H_7O)_4$ | 400 | 4500 | 0.04 | $BaTiO_3$ |
| 3 | $Ba(C_{11}H_{19}O_2)_2$ | $Ti(n-C_4H_9O)_4$ | 400 | 3800 | 0.02 | $BaTiO_3$ |
| 4 | $Ba(C_5HF_6O_2)_2$ | $TiO(C_5H_7O_2)_2$ | 370 | 3500 | 0.09 | $BaTiO_3$ |

Note: Values of $\epsilon\gamma$ were measured at 1 KHz and 25° C.

The second embodiment

Figure 2:
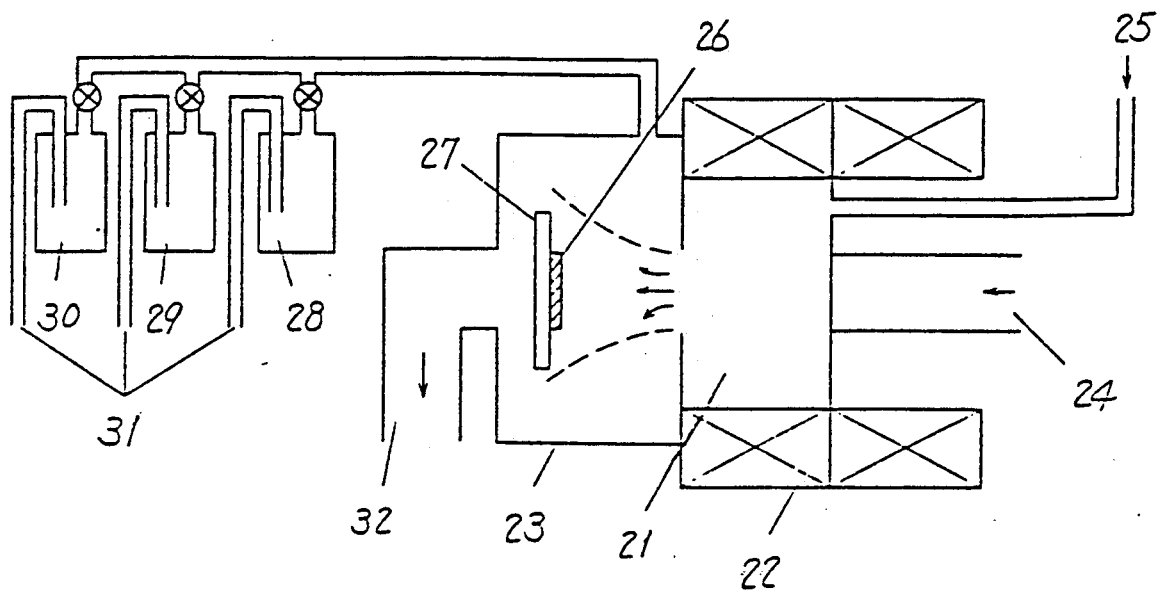
FIG. 2 is a schematic block diagram of an embodiment of an ECR plasma CVD apparatus according to the invention.

Refer now to FIG. 2. The reference numeral 21 designates a plasma chamber for generating high-density ECR plasma, and 22 an electromagnet for generating magnetic field needed for generating electron cyclotron resonance (ECR). The reference numeral 23 designates a reaction chamber, 24 an inlet of microwave having 2.45 GHz of frequency, 25 an inlet of oxygen as the source of generating plasma, 26 a substrate, and 27 a substrate holder. The reference numerals 28 through 30 respectively designate vaporizers each containing a raw material, 31 an inlet of carrier gas $N_2$, and 32 an exhaust port connected to an oil-sealed pump and a turbomolecular pump which compulsorily exhaust gas from the reaction chamber 23.

First, residual gas was removed from the plasma-generating chamber 21 and the reaction chamber 23 by lowering the inner pressure to $1.0 \times 10^{-6}$ Torr or lower. Next, oxygen was supplied as the source of generating plasma to the plasma-generating chamber 21 through the inlet 25 at 3.4 SCCM flow rate. Then, plasma was generated inside of the plasma chamber 21 by magnetic field diverged by electromagnet 22. By feeding 400 W, 2.45 GHz of microwave from the inlet 24, the plasma was drawn into the reaction chamber 23. In the meanwhile, barium dipivaloyl methane $Ba(DPM)_2$ and titanium tetra-isopropoxide $Ti(OC_3H_7)_4$ were respectively stored in the vaporizers 28 and 29 and then heated to 135° C. and 67° C., respectively, to vaporize them. The vaporized compounds were brought into contact with the active plasma for a half hour so that reaction can continuously be held. After completing these sequential processes, a dielectric film was formed on the platinum substrate 26.

Temperature of the platinum substrate constantly remained at 150° C. while the film formation was underway. The vacuum pressure was held at $5.2 \times 10^{-4}$ Torr throughout the period of film formation.

It was proved from analysis of the formed film that the film was composed of barium titanate $BaTiO_3$ having a Perovskite crystalline structure and a thickness of 1.8 microns. After forming opposite platinum electrodes by evaporation process, dielectric properties were measured. The result was that $\epsilon\gamma = 3800$ and $tan\delta = 0.04$. The same method was repeated using other kinds of organometallic compounds. Like the above case, satisfactory barium-titanate films having outstanding dielectric properties were obtained. The result of these experiments is shown in Table 2.

TABLE 2

| Sample No. | Starting material Vaporizer 28 | Vaporizer 29 | Substrate temperature (°C.) | $\epsilon\gamma$ | tan δ | Formed film |
|---|---|---|---|---|---|---|
| 5 | $Ba(C_{11}H_{19}O_2)_2$ | $Ti(OC_3H_7)_4$ | 150 | 3800 | 0.04 | $BaTiO_3$ |
| 6 | $Ba(C_{11}H_{19}O_2)_2$ | $Ti(n-C_3H_7O)_4$ | 120 | 4300 | 0.08 | $BaTiO_3$ |
| 7 | $Ba(C_{11}H_{19}O_2)_2$ | $Ti(n-C_4H_9O)_4$ | 160 | 4000 | 0.09 | $BaTiO_3$ |
| 8 | $Ba(C_5HF_6O_2)_2$ | $Ti(C_5H_7O_2)_2$ | 150 | 3700 | 0.10 | $BaTiO_3$ |

Note: Values of $\epsilon\gamma$ were measured at 1 KHz and 25° C.

The third embodiment

Again refer to FIG. 1. First, strontium dipivaloyl methane $Sr(DPM)_2$ was supplied to the vaporizer 6 and titanium tetraisopropoxide $Ti(OC_3H_7)_4$ to the vaporizer 7, and then these compounds were heated to 147° C. and 69° C., respectively. Then together with nitrogen carrier flowing itself at 4.0 SCCM flow rate, the vaporized compounds were supplied to the inner space of the reaction chamber 1 of low pressure reduced by the exhaust device 3. Simultaneously, oxygen was supplied as the source of generating plasma to the reaction chamber 1 at 14.0 SCCM flow rate, and then plasma was generated in the chamber 1 by feeding 0.5 $W/cm^2$ of electric power. Reaction was continued for 40 minutes under $7.6 \times 10^{-2}$ Torr of reduced pressure, to thereby forming a dielectric film on the platinum substrate heated constantly at 390° C. It was confirmed from analysis of the formed film that the formed film was a strontium-titanate $SrTiO_3$ film having a Perovskite crystalline structure and a thickness of 2.6 microns. After forming opposite platinum electrodes by evaporation process, dielectric properties of the film were measured. It was confirmed that $\epsilon\delta = 320$ and $tan\delta = 0.1$ of the dielectric constant was obtained. Other kinds of organometallic compounds were examined in the same way. Similarly to the above, satisfactory strontium-titanate $SrTiO_3$ films having outstanding dielectric properties were obtained. The result of the experiments is shown in Table 3.

TABLE 3

| Sample No. | Starting material Vaporizer 6 | Vaporizer 7 | Substrate temperature (°C.) | $\epsilon\gamma$ | tan δ | Formed film |
|---|---|---|---|---|---|---|
| 9 | $Sr(C_{11}H_{19}O_2)_2$ | $Ti(OC_3H_7)_4$ | 390 | 320 | 0.1 | $SrTiO_3$ |
| 10 | $Sr(C_{11}H_{19}O_2)_2$ | $Ti(n-C_3H_7O)_4$ | 380 | 370 | 0.1 | $SrTiO_3$ |
| 11 | $Sr(C_{11}H_{19}O_2)_2$ | $Ti(n-C_4H_9O)_4$ | 400 | 290 | 0.2 | $SrTiO_3$ |

TABLE 3-continued

| Sample No. | Starting material | | Substrate temperature (°C.) | $\epsilon\gamma$ | tan $\delta$ | Formed film |
| --- | --- | --- | --- | --- | --- | --- |
| | Vaporizer 6 | Vaporizer 7 | | | | |
| 12 | $Sr(C_5HF_6O_2)_2$ | $TiO(C_5H_7O_2)_2$ | 400 | 350 | 0.1 | $SrTiO_3$ |

Note: Values of $\epsilon\gamma$ were measured at 1 KHz and 25° C.

The fourth embodiment

Again refer to FIG. 2. First, residual gas was removed from the plasma chamber 21 and the reaction chamber 23 by reducing the pressure to $1.0 \times 10^{-6}$ Torr or lower. Next, oxygen was supplied as the source of generating plasma to the plasma chamber 21 through inlet 25 at 3.7 SCCM flow rate. Then, plasma was generated in the plasma chamber 21 by causing electromagnet 22 to diverge magnetic field inside of the plasma chamber 21. By radiating 450 W, 2.45 GHz of microwave through inlet 24, the plasma was moved to the reaction chamber 23. In the meanwhile, strontium dipivaloyl methane $Sr(DPM)_2$ and titanium tetra-isopropoxide $Ti(OC_3H_7)_4$ were stored in vaporizers 28 and 29, and then heated to 136° C. and 70° C., respectively. The vaporized compounds were brought into contact with and reacted with the active plasma for a half hour so that the reaction can continuously be held. Finally, a dielectric film was formed on the platinum substrate. Temperature of the platinum substrate constantly remained at 180° C. while the film formation was underway. The vacuum pressure was held at $5.7 \times 10^{-4}$ Torr throughout the period of film formation.

It was confirmed from analysis of the formed film that the film was a strontium titanate $SrTiO_3$ film having a Perovskite-type crystalline structure and a thickness of 2.1 microns. After forming opposite platinum electrodes by evaporation process, the dielectric properties were confirmed from measurement to be $\epsilon\gamma = 390$ and $\tan\delta = 0.1$. The same method was repeated using other kinds of organometallic compound. Like the above case, satisfactory strontium titanate films having outstanding dielectric properties were obtained. The result of the experiments is shown in Table 4.

The fifth embodiment

Again refer to FIG. 1. First, magnesium acetyl acetonate $[Mg(AA)_2]$ was supplied to the vaporizer 6, calcium dipivaloyl methane $[Ca(DPM)_2]$ to the vaporizer 7, and titanium tetra-isopropoxide $[Ti(OC_3H_7)]$ to the vaporizer 8. These compounds were respectively heated to 170° C., 140° C. and 70° C., to vaporize them. Together with nitrogen carrier flowing at 4.0 SCCM flow rate, the vaporized compounds were supplied to the inner space of the reaction chamber 1 of low pressure reduced by the exhaust device 3. Simultaneously, oxygen was supplied as the reaction gas to the inner space of the reaction chamber 1 at 12.0 SCCM flow rate to allow plasma to be generated (0.5 W/cm$^2$). Reaction of the vaporized compounds and the plasma was continued for an hour under $8.0 \times 10^{-2}$ Torr of reduced pressure, thereby to form a dielectric film on the platinum substrate heated at 550° C.

It was confirmed from analysis of the formed film that the film was a $Mg_{0.94}Ca_{0.06}TiO_3$ film having a Perovskite crystalline structure and a thickness of 5.1 microns. After forming opposite platinum electrodes by evaporation process, it was confirmed from measurement that dielectric constant $\epsilon Y = 23$ and temperature constant $Tc = 0 \pm 35$ ppm/° C. were obtained.

When magnesium acetyl acetonate and titanium tetraisopropoxide were used as the starting raw materials, a film composed of magnesium titanate $MgTiO_3$ was formed on the substrate heated at 580° C. On the other hand, when calcium dipivaloyl methane and titanium tetra-isopropoxide were used, a film composed of calcium titanate $CaTiO_3$ was formed on the substrate heated at 580° C. The former magnesium-titanate film showed 14 of dielectric constant and $Tc + 157$ ppm/° C. of temperature coefficient. The latter calcium titanate dielectric film generated $\epsilon = 134$ of dielectric constant and $Tc = -1470$ ppm/° C. of temperature co-efficient. These values are comparable to those of bulk material. Using other organometallic compounds, magnesium-calcium titanate $(Mg, Ca)TiO_3$ films were obtained at a 600° C. or lower of substrate temperature, with satisfactory dielectric constant and temperature coefficient comparable to those of bulk material.

The sixth embodiment

Again refer to FIG. 2. First, residual gas was removed by lowering the inner pressure of the plasma chamber 21 and the reaction chamber 23. Next, oxygen was supplied as the source of generating plasma to the plasma chamber 21 through inlet 25 at 3.4 SCCM flow rate. Simultaneously, 400 W, 2.45 GHz of microwave was supplied to the plasma chamber 21 through inlet 24, and then ECR plasma was generated by adjusting the intensity of magnetic field to 875 Gauss by means of electromagnet 22. At the same time, availing of the presence of magnetic field diverged by magnet 22, plasma generated in the plasma chamber 21 was drawn to the reaction chamber 23. In the meanwhile, magnesium acetyl acetonate, calcium dipivaloyl methane, and titanium tetra-isopropoxide were stored in the vaporizers 28, 29 and 30, and heated to 160° C., 135° C. and 65° C., respectively. Then the vaporized compounds were supplied to the reaction chamber 23 together with nitrogen carrier flowing at 1.3 SCCM rate. The vaporized compounds were brought into contact with and reacted with active plasma extracted from the plasma chamber 21. The reaction was continued for 40 minutes, to form

TABLE 4

| Sample No. | Starting material | | Substrate temperature (°C.) | $\epsilon\gamma$ | tan $\delta$ | Formed film |
| --- | --- | --- | --- | --- | --- | --- |
| | Vaporizer 28 | Vaporizer 29 | | | | |
| 13 | $Sr(C_{11}H_{19}O_2)_2$ | $Ti(OC_3H_7)_4$ | 180 | 390 | 0.1 | $SrTiO_3$ |
| 14 | $Sr(C_{11}H_{19}O_2)_2$ | $Ti(n-C_3H_7O)_4$ | 170 | 360 | 0.1 | $SrTiO_3$ |
| 15 | $Sr(C_{11}H_{19}O_2)_2$ | $Ti(n-C_4H_9O)_4$ | 140 | 310 | 0.1 | $SrTiO_3$ |
| 16 | $Sr(C_5HF_6O_2)_2$ | $TiO(C_5H_7O_2)_2$ | 170 | 400 | 0.1 | $SrTiO_3$ | a dielectric film on the platinum substrate. Temperature of the plutinum substrate constantly remained at 350° C. while the film formation was underway. The vacuum pressure remained at $5.8 \times 10^{-4}$ Torr throughout the period of film formation.

It was confirmed from analysis of the formed film that the film has a composition $Mg_{0.92}Ca_{0.08}TiO_3$ having a Perovskite crystal structure and a thickness 3.2 microns. After forming opposite platinum electrodes by evaporation process, it was confirmed that the film has a dielectric constant $\epsilon = 20$ and a temperature coefficient Tc $= 0 \pm 37$ ppm/° C.

When magnesium acetyl acetonate and titanium tetraisopropoxide were used as the raw materials, a dielectric film composed of magnesium titanate $MgTiO_3$ was obtained at 350° C. of substrate temperature. On the other hand, when calcium dipivaloyl methane and titanium tetra-isopropoxide were used, a dielectric film composed of calcium titanate $CaTiO_3$ was obtained at 350° C. of substrate temperature. The $MgTiO_3$ dielectric film showed a dielectric constant $\epsilon = 15$ and a temperature coefficient Tc $= \pm 142$ ppm/° C. The $CaTiO_3$ dielectric film showed $\epsilon = 122$ and Tc $= -1560$ ppm/° C. These values are comparable to those of bulk material.

Using other organometallic compounds as the raw materials, dielectric films composed of magnesium-calcium titanate $(Mg, Ca)TiO_3$ were formed at 400° C. or lower of substrate temperature.

The seventh embodiment

Again refer to FIG. 1. First, lead acetyl acetonate $Pb(C_5H_7O_2)_2$ was stored in the vaporizer 6 and titanium tetra-isopropoxide $Ti(OC_3H_7)_4$ was stored in the vaporizer 7, and then heated to 130° C. and 70° C., respectively. Next, the vaporized compounds were supplied to the inner space of the reaction chamber 1 having low pressure reduced by the exhaust device 3 together with nitrogen carrier flowing at 3.2 SCCM flow rate. Simultaneously, oxygen was supplied as the source of generating plasma to the reaction chamber 1 at 5.8 SCCM flow rate to generate plasma of 0.3 W/cm² of electric power. Reaction was continued for a half hour in presence of $8.5 \times 10^{-2}$ Torr of reduced pressure, thereby to form a dielectric film on the MgO(100) substrate heated at 280° C.

It was confirmed from analysis of the formed film that the film was a lead titanate $PbTiO_3$ film having a Perovskite crystal structure and a thickness of 2.2 microns. Furthermore, the lead titanate film formed by the above process was fully oriented in the direction of the axis C. This suggests that epitaxial growth took place as a result of perfect matching with the lattice constant of the substrate. The formed film had a specific dielectric constant $\epsilon^*/\epsilon_0 = 92$, a pyroelectric constant $\gamma = 3.4 \times 10^{-8}$ C/cm²K, $\tan\delta^* = 0.01$, and in addition, a specific resistance value of $9.3 \times 10^9$ Ω.cm.

The results of tests using other organometallic compounds and other substrates are shown in Table 5 together with the results of those tests described above.

TABLE 5

| Sample No. | Starting material | | Specific dielectric constant | Pyroelectric coefficient (C/cm² K) | Tan δ$^v$ | Resistivity (Ω · cm) | Substrate | Formed film |
|---|---|---|---|---|---|---|---|---|
| | Vaporizer 6 | Vaporizer 7 | | | | | | |
| 17 | $Pb(C_5H_7O_2)_2$ | $Ti(OC_3H_7)_4$ | 92 | $3.4 \times 10^{-8}$ | 0.01 | $9.3 \times 10^9$ | MgO(100) | Orientation to axis C $PbTiO_3$ |
| 18 | $Pb(C_5H_7O_2)_2$ | $Ti(n-C_3H_7O)_4$ | 100 | $2.7 \times 10^{-8}$ | 0.01 | $9.7 \times 10^9$ | MgO(100) | Orientation to axis C $PbTiO_3$ |
| 19 | $PB(C_2H_5)_4$ | $Ti(n-C_4H_9O)_4$ | 95 | $3.1 \times 10^{-8}$ | 0.01 | $9.8 \times 10^9$ | (001) $MgAl_2O_4$ | Orientation to axis C $PbTiO_3$ |
| 20 | $Pb(C_6H_5)_4$ | $TiO(C_5H_7O_2)_2$ | 92 | $3.0 \times 10^{-8}$ | 0.01 | $1.0 \times 10^{10}$ | (001) $MgAl_2O_4$ | Orientation to axis C $PbTiO_3$ |

Note: All the above test results were measured without polarization process.

The eighth embodiment

Again refer to FIG. 2. First, residual gas was removed from the plasma chamber 21 and the reaction chamber 23 which were depressurized to $1.0 \times 10^{-6}$ Torr. Next, oxygen was supplied as the source of generating plasma to the plasma chamber 21 via inlet 25 at 8.2 SCCM flow rate. Next, ECR plasma was generated by feeding 400 W, 2.45 GHz of microwave through inlet 24 and adjusting the intensity of magnetic field by means of electromagnet 22. Simultaneously, the ECR plasma was moved by magnetic field diverged from electromagnet 22 from the plasma chamber 21 to the reaction chamber 23. On the other hand, lead acetyl acetonate and titanium tetra-isopropoxide were stored in the vaporizers 28 and 29, respectively, and then heated to 120° C. and 65° C. The vaporized compounds were fed to the reaction chamber 23 together with nitrogen carrier flowing at 1.0 SCCM flow rate. The vaporized compounds were brought into contact with and reacted with active plasma which was extracted from the plasma chamber 21. The reaction was continued for a half hour to form a dielectric film on the MgO(100) substrate. Temperature of the MgO substrate constantly remained at 80° C., while the film formation was underway. The vacuum pressure remained at $4.6 \times 10^{-4}$ Torr throughout the period of film formation.

It was confirmed from the analysis of the formed film that the film was a lead titanate $PbTiO_3$ film having a Perovskite crystal structure and oriented in the direction of the axis C. The formed film had a thickness of 1.8 microns, a specific dielectric constant $\epsilon^*/\epsilon_0 = 85$, a pyroelectric coefficient $\gamma = 3.1 \times 10^{-8}$ C/cm²K , $\tan\delta^* = 0.02$ and a specific resistance value $\rho = 1.2 \times 10^{10}$ Ω.cm. The results of tests made for other organometallic compounds and other substrates are shown in Table 6 together with the results of those tests shown above.

TABLE 6

| Sample No. | Starting material Vaporizer 6 | Starting material Vaporizer 7 | Specific dielectric constant | Pyroelectric coefficient (C/cm² K) | Tan δ$^v$ | Resistivity (Ω · cm) | Substrate | Formed film |
|---|---|---|---|---|---|---|---|---|
| 21 | Pb(C$_5$H$_7$O$_2$)$_2$ | Ti(OC$_3$H$_7$)$_4$ | 85 | $3.1 \times 10^{-8}$ | 0.02 | $1.2 \times 10^{10}$ | MgO(100) | Orientation to axis C PbTiO$_3$ |
| 22 | Pb(C$_5$H$_7$O$_2$)$_2$ | Ti(n-C$_3$H$_7$O)$_4$ | 101 | $3.4 \times 10^{-8}$ | 0.01 | $9.9 \times 10^9$ | MgO(100) | Orientation to axis C PbTiO$_3$ |
| 23 | PB(C$_2$H$_5$)$_4$ | Ti(n-C$_4$H$_9$O)$_4$ | 92 | $3.1 \times 10^{-8}$ | 0.02 | $1.1 \times 10^{10}$ | (001) MgAl$_2$O$_4$ | Orientation to axis C PbTiO$_3$ |
| 24 | Pb(C$_6$H$_5$)$_4$ | TiO(C$_5$H$_7$O$_2$)$_2$ | 91 | $3.2 \times 10^{-8}$ | 0.01 | $1.0 \times 10^{10}$ | (001) MgAl$_2$O$_4$ | Orientation to axis C PbTiO$_3$ |

Note: All the above test results were measured without polarization process.

What is claimed is:

1. A method of manufacturing a dielectric film, in which vapor of an organometallic compound composed of a β-diketone metal complex containing barium, vapor of an organometallic compound composed of either a β-diketone metal complex containing titanium or a metal alkoxide containing titanium, and oxygen are decomposed and reacted in plasma which is generated by means of high-frequency discharge of electron cyclotron resonance under a reduced pressure of 10 through $10^{-4}$ Torr, thereby forming a perovskite-type film of barium titanate of the formula BaTiO$_3$ on a substrate heated to 400° C. or lower.

2. A method as set forth in claim 1, wherein said β-diketone metal complex containing barium is barium dipivaloyl methane of the formula Ba(C$_{11}$H$_{19}$O$_2$)$_2$, or barium hexafluoroacetylacetonate of the formula Ba(C$_5$HF$_6$O$_2$)$_2$.

3. A method as set forth in claim 1, wherein said β-diketone metal complex containing titanium is titanium oxyacetylacetonate of the formula TiO(C$_5$H$_7$O$_2$)$_2$, and said metal alkoxide containing titanium is titanium tetraisopropoxide of the formula Ti(OC$_3$H$_7$)$_4$, or tetra-n-propyl orthotitanate of the formula Ti(n-C$_3$H$_7$O)$_4$, or titanium tetra-n-butoxide of the formula Ti(n-C$_4$H$_9$O)$_4$.

4. A method of manufacturing a dielectric film, in which vapor of an organometallic compound composed of a β-diketone metal complex containing strontium, vapor of an organometallic compound composed of either a β-diketone metal complex containing titanium or a metal alkoxide containing titanium, and oxygen are decomposed and reacted in plasma which is generated by means of high-frequency discharge or electron cyclotron resonance under a reduced pressure of 10 through $10^{-4}$ Torr, thereby forming a perovskite-type film of strontium titanate of the formula SrTiO$_3$ on a substrate heated to 400° C. or lower.

5. A method as set forth in claim 4, wherein said β-diketone metal complex containing strontium is strontium dipivaloyl methane of the formula Sr(C$_{11}$H$_{19}$O$_2$)$_2$, or strontium hexafluoroacetylacetonate of the formula Sr(C$_5$HF$_6$O$_2$)$_2$.

6. A method as set forth in claim 4, wherein said β-diketone metal complex containing titanium is titanium oxyacetylacetonate of the formula TiO(C$_5$H$_7$O$_2$)$_2$, and said metal alkoxide containing titanium is titanium tetraisopropoxide of the formula Ti(OC$_3$H$_7$)$_4$, or tetra-n-propyl orthotitanate of the formula Ti(N-C$_3$H$_7$O)$_4$, or titanium tetra-n-butoxide of the formula Ti(n-C$_4$H$_9$O)$_4$.

7. A method of manufacturing a dielectric film, in which vapor of an organometallic compound composed of a β-diketone metal complex containing magnesium, vapor of an organometallic compound composed of either a β-diketone metal complex containing titanium or a metal alkoxide containing titanium, and oxygen are decomposed and reacted in plasma which is generated by means of high-frequency discharge or electron cyclotron resonance under a reduced pressure of 10 through $10^{-4}$ Torr, thereby forming a perovskite-type film of magnesium titanate of the formula MgTiO$_3$ on a substrate heated to 600° C. or lower.

8. A method as set forth in claim 7, wherein said β-diketone metal complex containing magnesium is magnesium acetylacetonate of the formula Mg(C$_5$H$_7$O$_2$)$_2$.

9. A method as set forth in claim 7, wherein said β-diketone metal complex containing titanium is titanium oxyacetylacetonate of the formula TiO(C$_5$H$_7$O$_2$)$_2$, and said metal alkoxide containing titanium is titanium tetraisopropoxide of the formula Ti(OC$_3$T$_7$)$_4$, or tetra-n-propyl orthotitanate of the formula Ti(n-C$_3$H$_7$O)$_4$, or titanium tetra-n-butoxide of the formula Ti(n-C$_4$H$_9$O)$_4$.

10. A method of manufacturing a dielectric film, in which vapor of an organometallic compound composed of a β-diketone metal complex containing calcium, vapor of an organometallic compound composed of either a β-diketone metal complex containing titanium or a metal alkoxide containing titanium, and oxygen are decomposed and reacted in plasma which is generated by means of high-frequency discharge or electron cyclotron resonance under a reduced pressure of 10 through $10^{-4}$ Torr, thereby forming a perovskite-type film of calcium titanate of the formula CaTiO$_3$ on a substrate heated to 600° C. or lower.

11. A method as set forth in claim 10, wherein said β-diketone metal complex containing calcium is calcium dipivaloyl methane of the formula Ca(C$_{11}$H$_{19}$O$_2$)$_2$.

12. A method as set forth in claim 10, wherein said β-diketone metal complex containing titanium is titanium oxyacetylacetonate of the formula TiO(C$_5$H$_7$O$_2$)$_2$, and said metal alkoxide containing titanium is titanium tetraisopropoxide of the formula Ti(OC$_3$H$_7$)$_4$, or tetra-n-propyl orthotitanate of the formula Ti(n-C$_3$H$_7$O)$_4$, or titanium tetra-n-butoxide of the formula (Ti(n-C$_4$H$_9$O)$_4$.

13. A method of manufacturing a dielectric film, in which vapor of an organometallic compound composed of a β-diketone metal complex containing magnesium, vapor of an organometallic compound composed of a β-diketone metal complex containing calcium, vapor of an organometallic compound composed of either a β-diketone metal complex containing titanium or a metal alkoxide containing titanium, and oxygen are decomposed and reacted in plasma which is generated by means of high-frequency discharge or electron cyclotron resonance under a reduced pressure of 10 through $10^{-4}$ Torr, thereby forming a film of perovskite-type magnesium-calcium titanate of the formula (Mg, Ca)TiO$_3$ on a substrate heated to 600° C. or lower.

14. A method as set forth in claim 13, wherein said β-diketone metal complex containing magnesium is magnesium acetylacetonate of the formula Mg(C$_5$H$_7$O$_2$)$_2$, and said β-diketone metal complex containing calcium is calcium dipivaloyl methane of the formula Ca(C$_{11}$H$_{19}$O$_2$)$_2$.

15. A method as set forth in claim 13, wherein said β-diketone metal complex containing titanium is titanium oxyacetylacetonate of the formula TiO(C$_5$H$_7$O$_2$)$_2$, and said metal alkoxide containing titanium is titanium tetraisopropoxide of the formula Ti(OC$_3$H$_7$)$_4$, or tetra-n-propyl orthotitanate of the formula Ti(n-C$_3$H$_7$O)$_4$, or titanium tetra-n-butoxide of the formula Ti(n-C$_4$H$_9$O)$_4$.

16. A method of manufacturing a dielectric film, in which vapor of an organometallic compound composed of a β-diketone metal complex containing lead, tetraethyl lead or tetraphenyl lead, vapor of an organometallic compound composed of either a β-diketone metal complex containing titanium or a metal alkoxide containing titanium, and oxygen are decomposed and reacted in plasma which is generated by means of high-frequency discharge or electron cyclotron resonance under a reduced pressure of 10 through $10^{-4}$ Torr, thereby forming on a substrate heated to 300° C. or lower a film of perovskite-type lead titanate of the formula PbTiO$_3$ which is oriented in the direction of c-axis and epitaxially grown with respect to the substrate.

17. A method as set forth in claim 16, wherein said β-diketone metal complex containing lead is lead acetylacetonate of the formula Pb(C$_4$H$_7$O$_2$)$_2$.

18. A method as set forth in claim 16, wherein said β-diketone metal complex containing titanium is titanium oxyacetylacetonate of the formula TiO(C$_5$H$_7$O$_2$)$_2$, and said metal alkoxide containing titanium is titanium tetraisopropoxide of the formula Ti(OC$_3$H$_7$)$_4$, or tetra-n-propyl orthotitanate of the formula Ti(n-C$_3$H$_7$O)$_4$, or titanium tetra-n-butoxide of the formula Ti(n-C$_4$H$_9$O)$_4$.

* * * * *